US005410166A

United States Patent [19]

Kennel

[11] Patent Number: 5,410,166

[45] Date of Patent: Apr. 25, 1995

[54] P-N JUNCTION NEGATIVE ELECTRON AFFINITY CATHODE

[75] Inventor: Elliot B. Kennel, Yellow Springs, Ohio

[73] Assignee: The United States of America as represented by the Secretary of the Air Force, Washington, D.C.

[21] Appl. No.: 55,168

[22] Filed: Apr. 28, 1993

[51] Int. Cl.[6] .......... H01L 29/161

[52] U.S. Cl. .......... 257/77; 257/183

[58] Field of Search .......... 257/77, 183

[56] References Cited

U.S. PATENT DOCUMENTS

| | | | |
|---|---|---|---|
| 4,277,293 | 7/1981 | Nelson et al. | 148/175 |
| 4,307,507 | 12/1981 | Gray et al. | 29/580 |
| 4,774,991 | 10/1988 | Holden | 164/46 |
| 5,074,456 | 12/1991 | Degner et al. | 228/121 |
| 5,129,850 | 7/1992 | Kane et al. | 445/24 |
| 5,141,460 | 8/1992 | Jaskie et al. | 445/24 |

OTHER PUBLICATIONS

M. W. Geis et al Diamond Cold Cathode IEEE Electron Device Letters, vol. 12, No. 8, pp. 456–459, Aug. 1991.

*Primary Examiner*—Mark V. Prenty
*Attorney, Agent, or Firm*—Gerald B. Hollins; Thomas L. Kundert

[57] ABSTRACT

A cold cathode electron sourcing arrangement wherein a negative electron affinity material such as p-type diamond is disposed adjacent a p-n junction in order that electron charge carriers originating in the p-n junction may be caused to flood the p-type diamond and increase its electrical conductivity and also provide a source for high current flow free electrons repelled from the surface of the diamond material. Theoretical consideration of the high current electron source is also disclosed. Use of the electron source in cathode ray tubes and other electron based apparatus is also included. The disclosed electron sourcing is distinguished from that of previously known n-type diamond.

9 Claims, 2 Drawing Sheets

P-N JUNCTION NEGATIVE ELECTRON AFFINITY CATHODE

RIGHTS OF THE GOVERNMENT

The invention described herein may be manufactured and used by for the Government of the United States for all governmental purposes without the payment of any royalty.

BACKGROUND OF THE INVENTION

This invention relates to the field of cold cathode charge emitters of the negative electron affinity (NEA) type.

Charge carrier emission of the present invention, e.g. electrons, is to be contrasted with conventional charge carrier emission arrangements such as the thermionic emission commonly employed in vacuum tubes, the Schottky emission employed in certain semiconductor devices, the field emission accomplished with high electric fields stress and generally high voltage potentials, photoelectric emission as employed in vacuum tube photo responsive devices such as the photomultiplier tube, and secondary emission wherein collisions between free and bound electrons result in a generation of additional free electrons.

By way of introducing the present invention a thermionic energy conversion apparatus may be first considered. The thermionic energy converter is an apparatus based upon the Richardson equation;

$$J'=(4\pi emk^2/h^3)T^2e^{-\Phi/kT}\ Amps/hu\ 2 \qquad (1)$$

where h is the Planck constant, m is the electronic mass, T is the electrode temperature, and Φ is the electrode work function. The constant at the equation front is the same for all metals, so that $$J'=12\Phi T^2e^{-\Phi/kT}\ Amps/cm^2. \qquad (1a)$$

A thermionic converter involves two electrode surfaces placed closed to each other; with one such electrode elevated in temperature above the other this hotter electrode emits more electrons than the cooler electrode. An electrical load connected to the two electrodes allows such a thermionic converter to be used as an electrical power source.

In such thermionic converters, as are shown in FIG. 2A and 2B of the drawings bare metals disposed in a vacuum can produce only small amounts of electric power because the work function of virtually all metals is too high to allow large amounts of emission and because as electrons are emitted from an emitter, a large negative potential forms in the inter-electrode space so that additional emissions are prohibited. This latter effect is especially strong unless the emitter to collector gap is small and on the order of ten microns or less. Both of these limitations are compensated by the introduction of cesium into the inter electrode gap however. Such cesium adsorbs onto the surface of the electrodes and creates a much lower work function of about 1.4 to 1.6 electron volts for collectors operating in the 800 to 1000 degree Kelvin temperature range. The low work function of bulk cesium i.e. about 1.8 electron volts and the formation of a dipole layer are due to the donation of electrons from the cesium to the metal substrate. Both of these factors contribute to a lower effective work function in a thermiomic convertor.

If however, a thermiomic convertor of this type is fabricated with graphite electrodes it has been found possible to observe unexpectedly high current density in the thermionic graphite electrodes during reverse bias operation with an applied voltage of several volts. It is believed that the n-p junction flooding phenomenon as described below (and as leads to the present invention) is a definitive explanation for these high current densities.

The existence of anomalously high current densities in plasmas attending the electrodes of a thermiomic convertor suggests of course the possibility of using the attending electron generation mechanism as a cold cathode source of electrons or as a cold cathode free electron generation source. Such a cold cathode free electron source is distinguished from the above recited conventional sources of electrons, that is, from thermiomic emission, Schottky emission, field emission, photoelectric emission and secondary emission.

The patent art indicates considerable activity relating to the generation of electrons. The patents resulting from this activity include U.S. Pat. No. 5,141,460 issued to J. E. Jaskie et all, U.S. Pat. No. 5,129,850 issued to R.C. Kane et all and U.S. Pat. No. 4,307,507 issued to H. F. Gray et all. Since each of these patents is concerned with field emission apparatus and the field emission phenomenon in general, the present negative electron affinity (NEA) related invention is readily distinguished from the disclosure of these patents.

Additional patent art is of background interest with respect to the present invention; this art includes U.S. Pat. No. 5,074,456 issued to R. L. Degner et all and concerned with a composite electrode for use in a plasma process. The Degner et all patent discloses that electrodes for plasma reactors have been formed from a material such as graphite and that such material may be purified to semiconductor purity. The Degner et all disclosure however does not teach the injection of n type charge carriers into the graphite material as is accomplished in the present invention. In addition, the U.S. Pat. No. 4,774,991 of J. A. Holden is concerned with the formation of a rotary grinding wheel dresser in which diamond particles are adhered to an internal graphite ceramic or metal surface. The Holden disclosure is however distinct from the present invention in that a cathode structure is not formed and the material surrounding the diamond is not an n-type charge carrier.

The U.S. Pat. No. 4,277,293 of R. S. Nelson et all is also of interest with respect to the present invention. This Nelson et all patent is concerned with a method for growing synthetic diamond crystal having increased electrical conductivity with respect to normal diamond crystal and involves the bonbardment of diamond crystals with a flux of high energy carbon ions. The Nelson patent diamond, however has a damaged crystal structure which includes so many defects as to be unsuited to the high quality diamond crystal requirements needed in applicant's electron emitter invention. The diamond crystal of applicant's invention remains of high latice integrity notwithstanding the carrier flooding accomplished from an adjacent p-n junction; this high quality diamond in readily distinguished over the bombarded crystal diamond disclosed in the Nelson patent.

In addition to these patent documents, two technical periodical publications by one M. W. Geis et all have suggested that diamond may be used as a cold cathode material in view of the available negative electron affinity characteristics of diamond. These Geis et all publications include the article "Diamond Cold Cathodes" presented at the Second International Symposium on Diamond Materials conducted by the Electro Chemical Society of 10 South Main St. Pennington, N.J. 08534-2896 and the related technical article "Diamond Cold Cathode" published in the Institute of Electrical and Electronic Engineers Electron Device Letters Volume 12, No. 8 and dated Aug. 1991.

The Geis et all electron emitter requires the fabrication of n-type diamond and therefore requires special fabrication techniques such as ion implantation of carbon ions. Such implantation is known to normally introduce undesirable side effects such as increased latice defect density and reduced electron mean free path length. The p-type diamond of the present invention is readily obtained from a diamond film growth process, but requires an injection of charge carriers from an adjacent n-type material as is described below and as is not employed by Geis et all.

Since therefore the Geis et all published articles disclose the use of n-type diamond as an emitting material and the present invention employs p-type diamond in this emitter capacity, the present invention is readily distinguished over the disclosures of Geis et al.

The following publications are also of general background interest with respect to the present invention.

1. The paper "Deep Level Transients Spectroscopy Study of Thin Film Diamond" from the topic Diamond, Silicon Carbide and Related Wide Bandgap Semiconductors, Materials Research Society Symposium Proceedings, vol. 162, Materials Research Society, 1990, pages 309–314.

2. The paper "Experimental Studies on Thermionic Devices with Cesium-Barrium Fillings" published at the Sukhumi Nuclear Power Engineering in Space Conference, Oct. 28–31 1992.

3. "Cold Field Emission from CVD Diamond Films Observed in emission Electron Microscopy," published in Electronic Letters 1 Aug. 1991 vol. 27 no. 16 pages 1459–1460.

SUMMARY OF THE INVENTION

In the present invention, cold cathode generation of free electrons is achieved through use of the negative electron affinity or NEA characteristics of a material such as diamond and charge carrier flooding of the NEA emitter material from a near-by forward biased n-p junction. The charge carrier or electron generation process is enhanced by the presence of graphite inclusion in the emitter material, by the presence of low energy surface states on the NEA columnar growth diamond particles and by the presence of a thin film coating of material such as cesium on the NEA diamond crystal particles. The invention provides a diamond related electron generation arrangement using the easily achieved p-type diamond rather than the difficult-to-produce n-type diamond.

It is therefore an object of the present invention to provide a cold cathode source of free electrons which operates according to the negative electron affinity principle.

It is another object of the invention to provide a cesium assisted cold cathode negative electron affinity source of electrons.

It is another object of the invention to provide a fabrication sequence which may be used for certain portions of a negative electron affinity cold cathode.

It is another object of the invention to provide an operating sequence for a negative electron affinity cold cathode apparatus.

It is another object of the invention to provide a negative electron affinity cold cathode arrangement in which charge carrier flooding from an n-p junction may be used to enhance the NEA materials conductivity and provide a source of NEA surface charge carriers.

It is another object of the invention to provide an alternate NEA material to diamond.

It is another object of the invention to provide for an enhanced NEA properties in a diamond crystal through the use of graphitic inclusions.

It is another object of the invention to provide alternative electron emission commencing steps for an NEA emitter.

It is another object of the invention to provide alternate substrate arrangements for a diamond NEA cold cathode system.

Additional objects and features of the invention will be understood from the following description and claims and from the accompanying drawings.

These and other objects of the invention are achieved by:

a low temperature and low voltage negative electron affinity method of generating free electrons in spatial regions comprising the steps of:

disposing an array of columnar growth p-type diamond crystals of predetermined micronic physical dimension and negative electron affinity band gap and surface work function across an n-type semiconductor substrate to form an arrayed plurality of diamond to semiconductor substrate pn junctions;

communicating a forward bias induced flow of electrons through said n-type substrate member and across said pn junction;

injecting said flow of electrons into said p-type diamond crystals to increase the electrical conductivity thereof and supply electrons to an exposed negative electron affinity surface portion of each said diamond crystal; and repelling free electrons from said exposed diamond surface portion of said diamond crystals into a surrounding spatial region.

DETAILED DESCRIPTION

Figure 1:
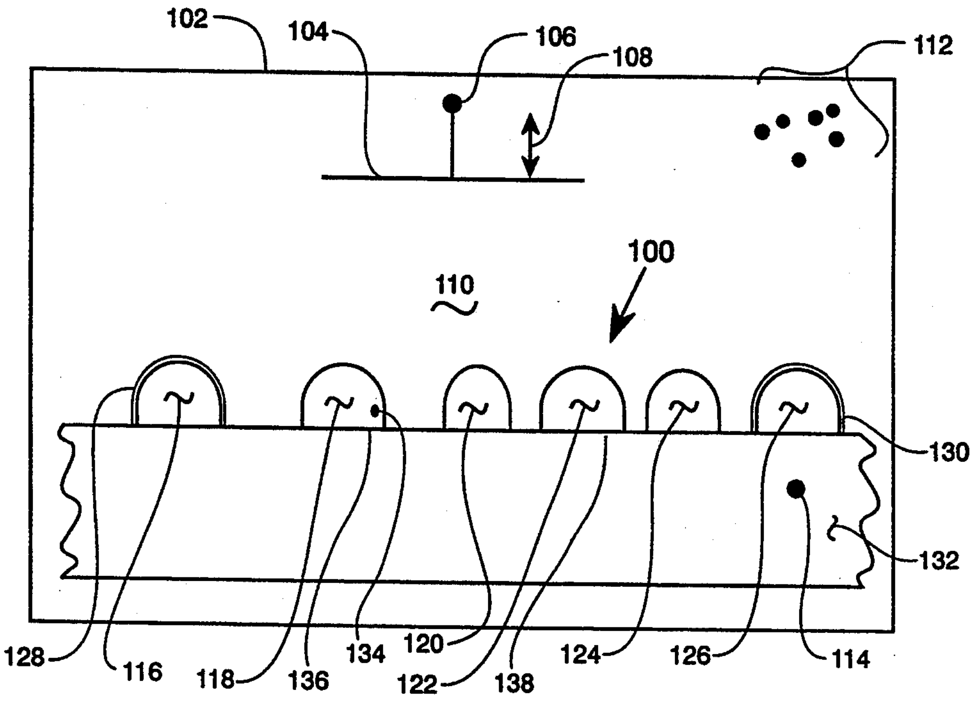
FIG. 1 shows a negative electron affinity array according to the invention in conjunction with an electron collecting anode and an enclosing container.
Figure 2A:
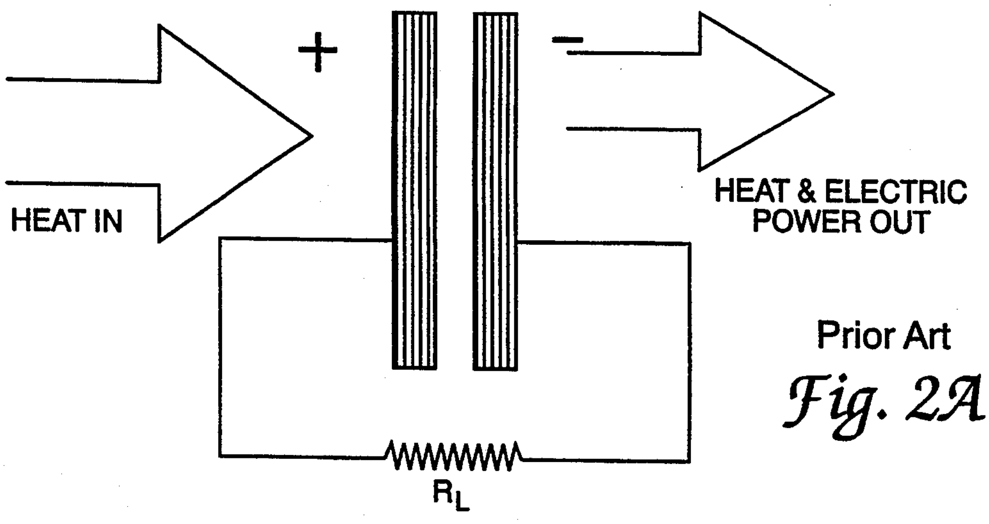
Prior Art Fig. 2A
FIG. 2A shows a thermionic converter in schematic form.
Figure 2B:
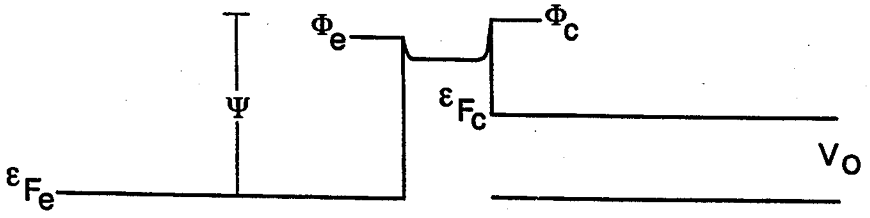
FIG. 2B shows a potential diagram for the FIG. 2A thermionic convertor.

FIG. 1 in the drawings shows a negative electron affinity or NEA source of electrons 100 that is in accordance with the present invention. The FIG. 1 source 100 is received within an enclosure 102 along with an electron collecting anode 104. The NEA apparatus 100 in FIG. 1 is shown to include a semiconductor substrate member 132 on which is received a plurality of diamond crystals particles 116, 118, 120, 122, 124, and 126. The FIG. 1 diamond crystal particles are preferably of one micron nominal size and are covered by a thin film atomic layer of metallic cesium as is typically indicated at 128 and 130 for the crystals 116 and 126 respectively.

The FIG. 1 apparatus further includes the anode electrode 104 and it's electrical terminal 106 with the anode being separated from the negative electron affinity charge carrier source 100 by the by the interelectrode space 110. The space 110 is arranged to be changeable in dimension as indicated at 108 and as will be discussed subsequently herein in connection with arrangements for commencing operation of the FIG. 1 apparatus. The interelectrode space 110 is to be filled with cesium vapor, as is represented at 112 in the FIG. 1 diagram, under certain operating conditions of the FIG. 1 apparatus when the cesium layers 128 and 130 are employed. During operation of the FIG. 1 apparatus the anode 104 is contemplated to have a potential of up to 20 volts positive with respect to the substrate member 132. The terminal 114 is used to represent a metal to semiconductor interface by which a zero volt operating potential of the substrate member 132 is determined.

In the FIG. 1 apparatus, the electron emitter consists of regions of low-doped p-type material such as sub-micron columnar diamond growths or highly ordered graphite. Other regions, such as grain boundaries with graphitic inclusions, are represented at 134 in FIG. 1 and are presumed to be more highly doped, due to a higher numbers of defects, are less strongly p-type; and may be designated as n-type or, probably more accurately (p-) type material. Under these conditions, the n-type regions 136 of the substrate 134 can inject electrons into the p-type material of the diamond crystal particles 116–126, thereby greatly increasing the electrical conductivity of the diamond material.

Diamond, and to a lesser extent graphite, are noteworthy because they are NEA emitters, particularly when coated with the surface monolayer of cesium indicated at 128 and 130. In such NEA materials the conduction band level lies higher than the electron work function. Thus, any charge carriers present in the conduction band can be emitted by the surface of the material without the addition of more energy to the system. Thus, electron emission is not limited by the work function in materials of this type, but by the amount of electron charge carriers which can be injected into the NEA emitter material or p-type diamond in FIG. 1.

Considering now the FIG. 1, interface of the p-type diamond crystal particles 116–126 with the n type semiconductor material 132 or the p-n junction at 138, for example; and also the junction of the diamond crystal 116 with the cesium 128 for example. When a metal and a semiconductor join, internal fields are produced at the interface and a contact potential arises on account of the different work functions of the metal and the semiconductor. For the FIG. 1 case of a p-type semiconductor joined to a metal, there are two possibilities, depending on the relative size of the work functions.

When the metal work function, $\Phi_m$, is smaller than that of the semiconductor, $\Phi_s$, the Fermi level, $E_F$, throughout the metal and semiconductor is constant if there is no current flowing. In the bulk material, the difference in energy between Fermi level and vacuum level (that is, the work function) is unchanged compared to the normal no-junction case. Similarly, the difference between Fermi level and valence and conduction bands $E_v$ and $E_c$ is unchanged. The forward bias direction is when electron current travels from semiconductor to metal.

Several arrangements for commencing the emission of electrons are possible in the FIG. 1 apparatus. These include a physical displacement of the anode 104 into touching relationship with the diamond crystals 116–126 as is represented by the movement indicating arrow 108 in FIG. 1. These arrangements also include filing the interelectrode space 110 with an electric arc supporting plasma and electrically pulsing either the anode 104 or the substrate 132 to a large voltage difference with respect to the other electrode in FIG. 1.

Figure 4:
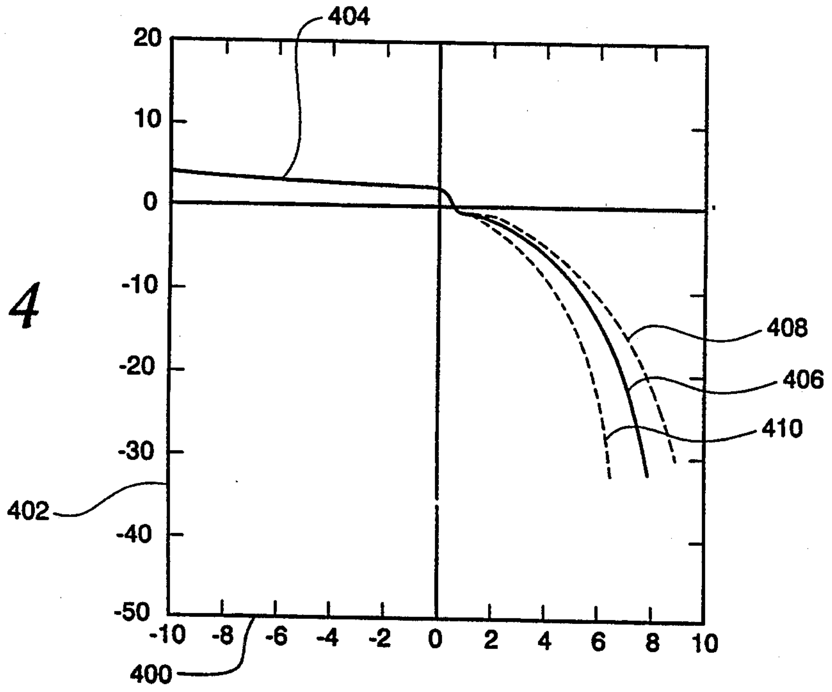
FIG. 4. shows a current versus voltage plot for a diamond film cathode of the type disclosed by the present invention.

FIG. 4 in the drawing shows the voltage vs. current characteristics of a diamond film electron emitter of the type shown in FIG. 1 of the drawings. In the FIG. 4 drawing voltage values above and below the zero volt level are shown along the horizontal axis 400 and current magnitudes above and below the zero current value are shown along the vertical axis 402. The positive voltage and negative current region at 406, 408, and 410 the curve 406 indicates a nominal device characteristic and the dotted curves 408 and 410 indicate an expected range of characteristics.

Figure 3A:
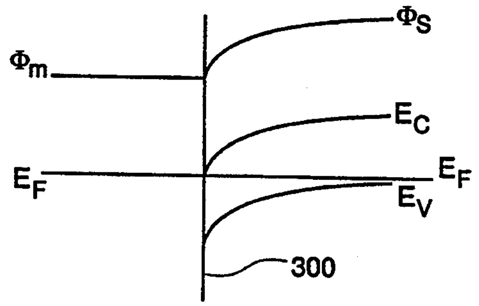
FIG. 3A shows the Fermi level and band configuration relationship for a rectifying metal/p-type junction.
Figure 3B:
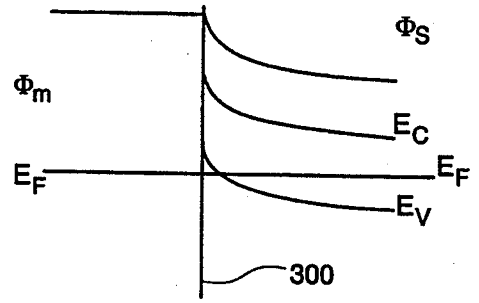
FIG.3B shows the Fermi and band configuration relationship for a non-rectifying metal/p-type junction.
Figure 3C:
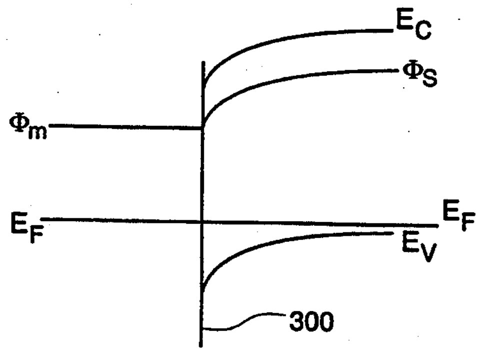
FIG. 3C shows the Fermi level and band relationship for a rectifying metal/negative electron affinity p-type junction as might exist in the cesium/diamond cathode of the present invention.

Turning now to FIG. 3, at the junction, 300 in FIG. 3B, the illustrated conduction and valence bands are bent downward by an amount approximately equal to the difference in work functions of the two materials. In the case where the metal work function is larger than the semiconductor work function, as in FIG. 3A the bands are bent upward by an amount roughly equal to the difference in the work functions, subject to the limitations described above. The junction is non-rectifying. A diamond-cesium junction is similar, except that the work function of the bulk material is lower than the bandgap, as is shown qualitatively in FIG. 3C. The band shape is determined by the Poisson equation.

$$\nabla\cdot\bar{D}=ne/\epsilon_o \quad (2)$$

where the vector quantity D is the electric flux density, equal to the electric field times the dielectric constant $\epsilon$, n is the density of charge carriers, and e is the electronic charge. From Maxwell's equations, equation (2) is solved by $$\phi = -\left(\frac{ne}{2\epsilon\epsilon_o}\right)x^2 \quad (3)$$

where x is the width of the depletion zone.

As an example, the depletion zone width for diamond may be calculated. The dielectric constant of diamond is about 6.5 or 6.5 times the vacuum constant. The charge carrier density can range from 1017 to 1020 cm−3. For a one electron volt differential between the Fermi level and top of the valence band, the width of the charge depletion region is $$x = [(6.5 * 8.85 \times 10^{-12} \text{ Coulomb}^2/N \cdot m^2) * 1\ v/10^{23} (1/m^3) * 1.6 \times 10^{-19} \text{ Coulomb}]^{1/2} = 2 \text{ to } 60 \text{ nm.}$$

For an emitter which is made up of very tiny (submicron) diamond columns (as is the case for FIG. 1 diamond films), in which columnar growth is expected, and with graphitic inclusions surrounding the diamond, depletion zones may make up a fairly substantial fraction of the volume. The width of the depletion zone for graphite is not easily calculated however, because of the even wider range of values of properties possible for graphite, but the same qualitative conclusions hold true.

Certain parts of this description are simplified. In metal-metal junctions (for example, in thermocouples), the contact potential is almost precisely equal to the difference in work functions. However, the semiconductor/metal case is less exact because of the much lower carrier density in the semiconductor, which results in a relatively thick charge layer to balance the contact potential in the semiconductor. The space charge region will therefore affect the value of the contact potential in the semiconductor. Similarly, the presence of energy states at the surface, which differ from those in the bulk material, may affect the work function of the surface. Clearly, chemical bonding at the junction will produce analogous effects as well. Thus, the contact potential is not as accurately calculable as in the case of metal-metal contacts. A related difficulty is that it is not obvious that a partial cesium monolayer should be treated as a bulk material. Despite the simplifications in this model, however, it gives qualitatively correct information about semiconductor-metal junction.

With respect to the Negative Electron Affinity or NEA emission occurring in FIG. 1, the band gap of a semiconductor and its work function are related, but distinctly different. In all semiconductors, the conduction band is separated from the valence band by a "forbidden zone." For many semiconductors of interest, the forbidden zone is in the range of electron volts, ie diamond, with a band gap of some 4.5 eV, is a very large band gap material. The band gap is the energy that a negative charge must acquire in order to boost itself from the valence band to the conduction band. The Fermi level, or median energy of charge carriers, is located within the forbidden region.

The work function is the energy required to excite a charge carrier from the Fermi level to the vacuum level. If the vacuum level lies below the bottom of the conduction band, then the electrons in the conduction band do not require any energy to leave the surface and the surface is referred-to as a Negative Electron Affinity or NEA emitter.

The values of band gap energy and work function are also dependent upon the crystal orientation and surface condition. Diamond, with a bandgap of some 4.5 eV and a work function in the range of 4 eV, is a natural NEA emitter. With the addition of cesium, it is an exceptionally strong NEA emitter. With the addition of cesium or cesium/oxygen dipole layers, the NEA characteristic becomes even more pronounced.

Near the surface, the conduction band of diamond must bend to accommodate the very low work function of the cesium. Consequently, a very steep internal potential gradient may exist near the surface of the material and this steep gradient causes electrons to be accelerated from the surface of the diamond.

Although from this standpoint, diamond and graphite appear to be excellent thermionic emitter materials, it must also be considered that there are few free electrons in either material. Therefore, while the low apparent work functions are significant, a question arises as to how electrons are to travel from the electrode substrate 132 to the surface of the diamond crystal emitters 116–126 in FIG. 1. Indeed, diamond acts as an insulator at the temperatures of interest for the present cold cathode invention. At 800° K, for example, the resistivity of diamond is about 108 ohm-cm. This means that for a 5 micron thick diamond coating to pass a current density of 1 amp/cm2, the driving voltage must be 5000 volts—clearly an improvement in this requirement is necessary to achieve a low voltage cold cathode electron source. This improvement involves an injection of n-type charge carriers into the diamond crystals 116–126 in FIG. 1.

An increase in the diamond carrier concentration can in fact be accomplished by injecting charge carriers via a heavily doped n-type semiconductor junction. In such a junction the Fermi level is very close to the doped conduction band in the n-type material and somewhat farther away for the less doped p-type material. The space charge region of the heavily doped n-type junction side is consequently narrower because of the high concentration of impurities.

In the forward biased junction mode, the forward current will consist almost entirely of majority carriers, or electrons. These electrons will be carried into the more lightly doped diamond p region and will there be so numerous as to flood the region, resulting in an increased conductivity in the p-type region near the junction. Farther away from the junction, many of these excess carriers will be annihilated by combining with holes in the p-type material, resulting in diminishing conductivity.

This influx of electrons also creates a nonequilibrium situation since the electrons have a finite lifetime before they are destroyed. To counter this imbalance, holes from the external circuit flow into the p-type region, neutralizing the space charge and accelerating recombination. This effect likewise results in a nonequilibrium situation because the influx of holes also exceeds the p-n product.

The net effect of this entire injection process under forward bias is to maintain a very high conductivity in the normally high resistivity diamond p-type region, causing large currents to flow for a very modest forward bias. The overall bulk resistivity of the junction and normal regions is reduced many times compared to the case of a symmetrical junction.

To what degree does a diamond film electode resemble the asymmetrical forward biased n-p junction? Columnar diamond growth clearly have few charge carriers and a low doping density. The surrounding graphite inclusions, on the other hand, are full of defects which produce charge carriers of both the n-type and p-type. It can easily be supported that charge carrier concentrations are hundreds to thousands of times more prevalent in the region immediately outside the diamond columnar growths. Although these randomized areas are not necessarily truly n-type, any p-type conduction is less dominant. This type of material can therefore probably be more accurately designated p-, but similar reasoning applies.

Therefore, a diamond or a graphite electrode is believed to have individual areas which are more strongly p-type and more defect-free than the surrounding material. Thus it is reasoned that these sites act as receptors for the injection of n type charges in the FIG. 1 apparatus.

In an experimental substantiation of the NEA emission properties of the present p-type diamond material, a foil array of 5 to 10 micron diamond has been operated as an emitter in a converter disposed in an evacuated multiple port bell jar chamber. In this substantiation the total resistance through the foil is 3–5 ohms with the finite resistance being attributed microperforations in the diamond coating or possible graphitic inclusions. When inserted in the chamber with a collector temperature of 700 K, the emitter temperature at 1250 K and a cesium reservoir temperature of 570 K, and a chamber pressure of 570 mbar, after approximately one hour of operation and a cesium reservoir temperature increase to 670 K, an NEA current appears. This current however, is not stable, varying irregularly about the point V=8 v and I=6A. Assuming an effective area of 0.16 cm2, this corresponds to about 37.5 A/cm2. After such experiment, the diamond layer is fully intact; a small scratch seen before installation is no longer visible and the resistance is the same as at the beginning of the verification.

The converter therefor operates successfully with diamond moreover, the emission of tens of amps per square centimeters at bias voltages of 5 v is anomalous because the thermionic emission properties of the electrode, would not normally allow such a high current. In addition, the very high resistivity of diamond ($10^8$ ohm-cm at 800 K) make it normally incapable of conducting current above the microamp range with low voltage potentials .

Therefore, some mechanism for high electrical conduction in diamond such as the herein disclosed semiconductor mechanism is present at the electron emitter electrode. Based on the resistivity, it is believed that there are many graphitic inclusions or diamond like-carbon (DLC) regions present in the electrode.

It is also found that the diamond films can be observed without an illuminating light source, indicating that some anomalous electron emission occurs in response to the electric field present. With a field strength of a relatively low 3 MV/m; the current produced is about 10 mA/cm. The most striking feature of the images obtained is the uniformity of emission from the diamond film. For a field emitter array, as would be the case for a surface consisting of pointed crystallites, the tips of the diamond facets should be the brightest emitters. This is not the case however. Instead, there are several areas between pointed crystallites which show strong emission characteristics.

A composite p-type electrode may be arranged as an alternative to the FIG. 1 electron source. Such an electrode consists of a metal substrate with a composite thin film of several microns thickness disposed on the outward surface. The thin film consists of p-type semiconducting material such as diamond embedded in a matrix of n-type or metallic-electron-conduction material. Because diamond films tend to consist of submicron columnar growths with a preferential outward orientation, the normal diamond film growth processes of either microwave assisted gas decomposition or hot filament methods are believed to be adequate for this purpose. Although typically, most persons in the art attempt to minimize graphitic inclusions while producing such films it is in this case desirable and possible to deliberately grow more graphitic diamond by varying the gas (e.g. methane) concentration and temperature of the plasma to an optimum concentration.

I believe that graphitic inclusions in the diamond film, together with low energy surface states on the diamond columns fill the requirement for a highly doped n-type or p matrix. The function of the diamond columns are to act as negative electron affinity or NEA emitters. The surrounding n-type or (p-) type material acts as a charge carrier injector for the diamond, which serves to drastically reduce the electrical resistivity of the diamond or graphite.

The electron current in this device is limited by the ability to inject electron charge carriers in the diamond conduction band. It is further believed that the band-gap, which affects the charge carrier density, may be reduced locally by the presence of low-energy surface states in the diamond. This would allow higher than predicted current flow.

The band gap and charge carrier density are further affected by high temperatures. Higher temperature results in an exponential increase in the current carrying capabilities of the diamond.

Alternative configurations may include a diamond fiber composite in a metal matrix with the fiber axes aligned towards the emission direction.

An n-type diamond or even (p-) type diamond with reduced bandgap would further enhance the performance of the electrode by permitting higher charge carrier concentrations. Such diamond is presently difficult to achieve in the herein desired form-as is described above.

Applications of diamond electrodes as described herein include the following:

a. Cold cathodes, used in television cathode ray tubes, free electron lasers, and other electronic power switching.
b. Composite emitter usage in power-producing thermionic elements.
c. Thermionic switches, such as the tacitron.
d. Pumping of semiconductor lasers, including microlasers.

While the apparatus and method herein described constitute a preferred embodiment of the invention, it is to be understood that the invention is not limited to this precise form of apparatus or method and that changes may be made therein without departing from the scope of the invention which is defined in the appended claims.

I claim:

1. A low temperature and low voltage negative electron affinity method of generating free electrons in a spatial region comprising the steps of:

disposing an array of columnar growth p-type diamond crystals of predetermined micronic physical dimension and negative electron affinity band gap and surface work function across an n-type semiconductor substrate surface to form an arrayed plurality of diamond to semiconductor substrate p-n junctions;

communicating a forward bias induced flooding flow of electrons through said n-type substrate member and across said p-n junctions;

injecting electrons from said flooding flow of electrons into each of said p-type diamond crystals to increase the electrical conductivity thereof and to supply electrons to an exposed negative electron affinity surface portion of each said diamond crystal; and repelling free electrons from said exposed diamond surface portion of said diamond crystals into a surrounding spatial region.

2. The method of claim 1 further including the step of surrounding said diamond crystals with a plasma of cesium ions.

3. The method of claim 2 wherein said surrounding step is preceded by the step of coating said diamond crystals with an atomic monolayer thin film of metallic cesium.

4. The method of claim 1 wherein said disposing step includes decomposing a carbonaceous gas in a microwave radio frequency electric field to form said diamond crystals.

5. The method of claim 4 wherein said disposing step includes forming charge carrier generating randomized graphitic inclusion areas adjacent said columnar growth diamond crystals.

6. The method of claim 1 wherein said communicating step includes applying a forward biasing electrical potential across each said combination of diamond crystal and p-n junction in said array.

7. The method of claim 6 wherein said forward biasing electrical potential has a voltage less than twenty volts.

8. The method of claim 1 wherein said disposing step is preceded by the additional step of highly doping said substrate member to an impurity concentration level greater than that of said p-type diamond material.

9. The method of claim 1 further including the step of initiating said generation of free electrons with one of the diamond voltage gradient inducing steps of:

establishing a temporary physical touching between an electron collecting anode member and said diamond crystals, filling an inter-electrode space separating said anode from said diamond crystals with an electric arc supporting plasma, and striking an arc in said plasma; and electrically pulsing said substrate and said diamond crystals to a larger negative voltage than a normal operating voltage with respect to said anode member.

* * * * *